US012683555B2

(12) United States Patent
Bellaouar et al.

(10) Patent No.: US 12,683,555 B2
(45) Date of Patent: Jul. 14, 2026

(54) POWER AMPLIFIER WITH BIASING SCHEME ENABLING HIGH POWER OPERATION

(71) Applicant: GlobalFoundries U.S. Inc., Malta, NY (US)

(72) Inventors: Abdellatif Bellaouar, Richardson, TX (US); Shafiullah Syed, Murphy, TX (US)

(73) Assignee: GlobalFoundries U.S. Inc., Malta, NY (US)

( * ) Notice: Subject to any disclaimer, the term of this patent is extended or adjusted under 35 U.S.C. 154(b) by 448 days.

(21) Appl. No.: 18/479,205

(22) Filed: Oct. 2, 2023

(65) Prior Publication Data

US 2025/0112598 A1 Apr. 3, 2025

(51) Int. Cl.
*H03F 1/30* (2006.01)
*H03F 3/21* (2006.01)

(52) U.S. Cl.
CPC ................. *H03F 1/30* (2013.01); *H03F 3/21* (2013.01); *H03F 2200/447* (2013.01); *H03F 2200/451* (2013.01)

(58) Field of Classification Search
CPC ........ H03F 1/30; H03F 3/21; H03F 2200/447; H03F 2200/451
USPC ........................................................ 330/289
See application file for complete search history.

(56) References Cited

U.S. PATENT DOCUMENTS

| | | | | |
|---|---|---|---|---|
| 6,169,885 B1 * | 1/2001 | Walukas | .................. | H04B 1/44 |
| | | | | 330/297 |
| 10,291,183 B1 * | 5/2019 | Syed | ...................... | H03F 1/0211 |
| 2012/0007676 A1 * | 1/2012 | Lee | ...................... | H03F 3/45183 |
| | | | | 330/253 |
| 2018/0269229 A1 * | 9/2018 | Or-Bach | .............. | H10D 84/907 |
| 2019/0267946 A1 | 8/2019 | Syed et al. | | |

OTHER PUBLICATIONS

Sufyan, Mohammad, "Fully Depleted Silicon on Insulator (FDSOI) Theory, Design and Applications for Modern Engineers," Wevolver article (2015) ("FDSOI Article") (Year: 2025).*

(Continued)

*Primary Examiner* — Hafizur Rahman
(74) *Attorney, Agent, or Firm* — David Cain; Hoffman Warnick LLC

(57) ABSTRACT

A disclosed structure includes a power amplifier and circuitry for implementing a biasing scheme that enables high power operation. The power amplifier includes parallel transistor chains connected to input and output transformers. Each chain includes series-connected first, second, and third n-type field effect transistors (NFETs) having front and back gates. The output transformer receives a variable positive power supply voltage generated using average power tracking. Front and back gates of each third NFET receive a positive bias voltage greater than or equal to the variable positive power supply voltage and a negative bias voltage, respectively. By negative back biasing the third NFETs, threshold voltages thereof are raised so a high positive bias voltage can be applied to the front gates to increase power output without violating reliability specifications. Optionally, by making the negative bias voltage temperature dependent, voltages at source regions of the third NFETs are held constant.

20 Claims, 6 Drawing Sheets

(56) References Cited

OTHER PUBLICATIONS

Aikio et al., "Ka-Band 3-Stack Power Amplifier with 18.8 dBm Psat and 23.4 % PAE Using 22nm CMOS FDSOI Technology," 2019 IEEE Topical Conference on RF/Microwave Power Amplifiers for Radio and Wireless Applications (PAWR), retrieved from IEEE Xplore on Sep. 14, 2023, 3 pages.

Ku et al., "CMOS Integrated Circuits for X-band Phased Array Systems," Aug. 2011 IEEE 54th International Midwest Symposium on Circuits and Systems (MWSCAS), 5 pages.

Li et al., "0.5W X-Band SOI 4-Channel Beamforming TR IC," 2021 IEEE 14th International Conference on ASIC (ASICON), 4 pages.

Wang et al., "A 5.2-to-13GHz Class-AB CMOS Power Amplifier with a 25.2dBm Peak Output Power at 21.6% PAE," ISSCC 2010, Session 2, mm-WAVE Beamforming & RF Building Blocks, 2.4, 2010 IEEE International Solid-State Circuits Conference— (ISSCC), 3 pages.

European Search Report for corresponding EP Application No. 23210094.1 dated Jun. 5, 2024, 15 pages.

Kuo et al., "A 24 GHz CMOS Power Amplifier Using Reversed Body Bias Technique to Improve Linearity and Power Added Efficiency," 2012 IEEE, 3 pages.

Li et al., "A 28GHz 41.7%-PAE 17.9dBm-Psat Power Amplifier Using Negative Body-Bias Technique in 40nm CMOS," 2022 IEEE MTT-S International Microwave Workshop Series on Advanced Materials and Processes for RF and THz Applications (IMWS-AMP), 4 pages.

* cited by examiner

| Biased Voltage /Supply | Example Value |
|---|---|
| VDD_APT | 2.6V |
| VG2 | 2.9V |
| VG1 | 1.4V |
| VBGN @ room temperature | -2.0V |
| VCP/VCM | 1.7V |

Power-Added
Efficiency (PAE)
(%)

| Biased Voltage /Supply | Example Value |
|---|---|
| VDD_APT | 1.8V |
| VG2 | 2.0V |
| VG1 | 1.2V |
| VBGN @ room temperature | -0.8V |
| VCP/VCM | 1.14V |

POWER AMPLIFIER WITH BIASING SCHEME ENABLING HIGH POWER OPERATION

BACKGROUND

The present disclosure relates to power amplifiers and, more particularly, to embodiments of a circuit structure including a power amplifier with a biasing scheme that enables high power operation.

A radio frequency integrated circuit (RFIC) is an integrated circuit (IC) that includes RF devices and/or circuitry configured to operate at frequencies within the radio spectrum and that optionally, includes other non-RF devices. The radio spectrum includes RF signals with frequencies ranging from 3 Hz to 300 GHz. RFIC applications include, but are not limited to, wireless communication applications (e.g., mobile phones, Wi-Fi devices, Bluetooth devices, satellite transceivers, etc.), radar system applications, military applications, imaging applications, etc. Developing RFIC applications are being designed to operate at faster speeds and in new bands including, but not limited to, within the 7-24 GHz range. RFICs operating in the new bands will require power amplifiers with a saturation power (Psat) that is relatively high. For example, currently available RFICs operating in the 28 GHz band will demand power amplifiers that exhibit a Psat of approximately 22 dBm, whereas RFICs that will operate in the 13 GHz band will demand power amplifiers that exhibit a higher Psat of approximately 28 dBm. However, currently available power amplifiers typically cannot reliably achieve such operating parameters.

SUMMARY

Disclosed herein are embodiments of a circuit structure including a power amplifier. The power amplifier can include an output transformer, which is connected to receive a positive power supply voltage, and which has input terminals. The power amplifier can further include parallel transistor chains, which are connected to the input terminals, respectively, of the output transformer. Each transistor chain can include an N-type field effect transistor (NFET) having a front gate, which is connected to receive a positive bias voltage, and a back gate, which is connected to receive a negative bias voltage.

Some embodiments of a circuit structure disclosed herein can include multiple voltage generators and a power amplifier. The voltage generators can output a positive power supply voltage, a negative bias voltage, a first positive bias voltage, and a second positive bias voltage. The positive power supply voltage can be higher (i.e., at a higher positive voltage level) than the first positive bias voltage and lower (i.e., at a lower positive voltage level) than the second positive bias voltage. The power amplifier can include an input transformer, which has output terminals. The power amplifier can further include an output transformer, which is connected to receive the positive power supply voltage, and which has input terminals. The power amplifier can further include parallel transistor chains, which are connected between the input transformer and the output transformer. Each transistor chain can include a first N-type field effect transistor (NFET), a second NFET, and a third NFET, which are connected in series between ground and an input terminal of the output transformer. Additionally, the first NFET in each transistor chain can have a first back gate, which is connected to ground, and a first front gate, which is connected to an output terminal of the input transformer. The second NFET of each transistor chain has a second back gate, which is connected to ground, and a second front gate, which is connected to receive the first positive bias voltage. The third NFET of each transistor chain has a third back gate, which is connected to receive the negative bias voltage, and a third front gate, which is connected to receive the second positive bias voltage.

Other embodiments of a circuit structure disclosed herein can include multiple voltage generators and a power amplifier. The voltage generators can output a positive power supply voltage, a negative bias voltage, a first positive bias voltage, and a second positive bias voltage. The positive power supply voltage can be higher than the first positive bias voltage and lower than the second positive bias voltage. The power amplifier can include an input transformer, which has output terminals, and an output transformer, which is connected to receive the positive power supply voltage, and which has input terminals. The power amplifier can further include parallel transistor chains, which are connected between the input transformer and the output transformer. Each transistor chain can include a first N-type field effect transistor (NFET), a second NFET, and a third NFET, which are connected in series between ground and an input terminal of the output transformer. Additionally, the first NFET and the second NFET of each transistor chain can have lower threshold voltages than the third NFET. Furthermore, the first NFET has a first back gate, which is connected to ground, and a first front gate, which is connected to an output terminal of the input transformer. The second NFET has a second back gate, which is connected to ground, and a second front gate, which is connected to receive the first positive bias voltage. The third NFET has a third back gate, which is connected to receive the negative bias voltage, and a third front gate, which is connected to receive the second positive bias voltage.

It should be noted that all aspects, examples, and features of disclosed embodiments mentioned in the summary above can be combined in any technically possible way. That is, two or more aspects of any of the disclosed embodiments, including those described in this summary section, may be combined to form implementations not specifically described herein. The details of one or more implementations are set forth in the accompanying drawings and the description below. Other features, objects and advantages will be apparent from the description and drawings, and from the claims.

BRIEF DESCRIPTION OF THE DRAWINGS

The present disclosure will be better understood from the following detailed description with reference to the drawings, which are not necessarily drawn to scale and in which.

DETAILED DESCRIPTION

Figure 1A:
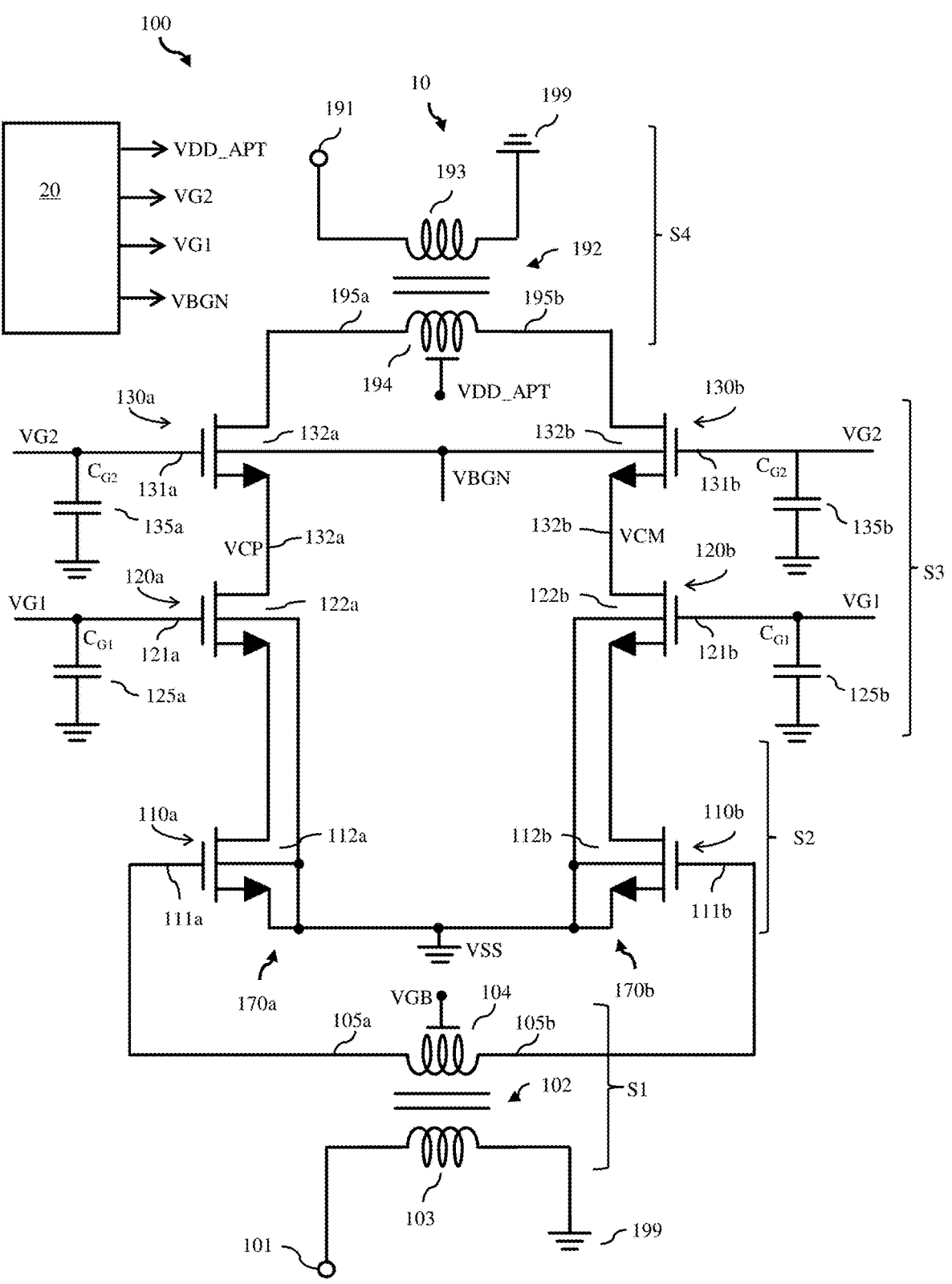
FIG. 1A is a schematic diagram illustrating disclosed embodiments of a circuit structure.

As mentioned above, developing RFIC applications are being designed to operate at faster speeds and in new bands including, but not limited to, within the 7-24 GHz range. RFICs operating in the new bands will require power amplifiers with a relatively high saturation power (Psat). For example, currently available RFICs operating in the 28 GHz band demand power amplifiers that exhibit a Psat of approximately 22 dBm, whereas RFICs that will operate in the 13 GHz band will demand power amplifiers that exhibit a higher Psat of approximately 28 dBm. However, currently available power amplifiers typically cannot reliably achieve such operating parameters.

In view of the foregoing disclosed herein are embodiments of a circuit structure including a power amplifier along with additional circuitry (e.g., multiple different voltage generators) for implementing a biasing scheme that enables high power operation (e.g., RFIC operation in the 13 GHz band using power amplifiers that exhibit a Psat of approximately 28 dBm). The power amplifier can include two parallel symmetric transistor chains having opposite ends connected to input and output transformers. Each transistor chain can include series-connected first, second, and third n-type field effect transistor (NFETs). The circuit structure can, for example, be implemented in a fully depleted semiconductor-on-insulator (e.g., a fully depleted silicon-on-insulator (FDSOI)) technology processing platform such that the various NFETs within the chains have both front and back gates, as discussed in greater detail below, and the particular biasing conditions applied to the front and back gates thereof facilitate the desired high-power operation. Specifically, the output transformer can receive a variable positive power supply voltage, which is generated, for example, using average power tracking (i.e., based on the average power out of the power amplifier). Drain regions of the third NFETs can be connected to different input terminals, respectively, of the output transformer, while the source regions thereof can be connected to the second NFETs. Front gates of the third NFETs can be connected to receive the same positive bias voltage. Back gates of the third NFETs can be connected to receive a negative bias voltage, which is, optionally, temperature dependent. By negative back biasing the third NFETs, the threshold voltages thereof are raised. Thus, a relatively high positive bias voltage can be applied to the front gates to increase the power output of the power amplifier without violating reliability specifications for the third NFETs. For example, the positive bias voltage applied to the front gates of the third NFETs can be at the same voltage level or higher than that of the variable positive power supply voltage coupled to the output transformer. Furthermore, by making the negative bias voltage temperature dependent, voltages at the source regions of the third NFETs that can vary with changes in temperature can be held constant. Gate biasing for the first and second NFETs in each chain is discussed in greater detail below. Optionally, such a circuit structure can operate in a power control mode (also referred to herein as a battery power savings mode) during which the various biasing voltages (including, but not limited to, the variable positive power supply voltage, the variable positive bias voltage, and the negative bias voltage) can be scaled (e.g., on-demand or automatically when the average output power of the power amplifier drops below some threshold level).

Figure 1B:
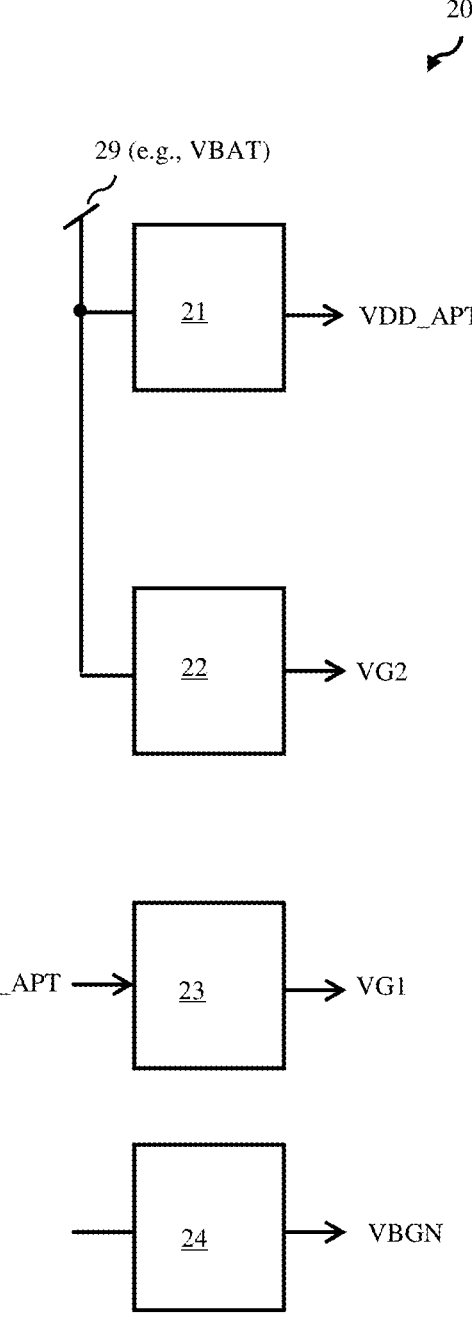
FIG. 1B is a schematic diagram illustrating, in greater detail, circuitry within the circuit structure of FIG. 1A.

More particularly, FIG. 1A is a schematic diagram illustrating an embodiment of circuit structure 100 including a power amplifier 10 along with additional circuitry 20 (e.g., multiple different voltage generators, discussed in greater detail below) for generating various voltages that can be employed to implement a biasing scheme that enables high power operation. That is, given the biasing scheme, power amplifier 10 can exhibit a relatively high Psat (e.g., a Psat of approximately 28 dBm) and, thus, can be incorporated into a next generation RFIC that operates at a band (e.g., the 13 GHz band) within the 7-24 GHz range. FIG. 1B is a schematic diagram illustrating, in greater detail, additional circuitry 20.

Referring to FIG. 1A, power amplifier 10 can include an input stage (S1), a drive stage (S2), a power stage (S3), and an output stage (S4).

Input stage (S1) can include, for example, a radio frequency (RF) input transformer 102 (also referred to herein as an input transformer) to match the input impedance of input stage (S1) to that of the preceding stage. Input transformer 102 can include two magnetically coupled input windings 103 and 104. Input winding 103 can have input terminals at opposite ends. In some embodiments, as illustrated, one input terminal of input winding 103 can be electrically connected to an input node 101 for receiving an RF input signal and the other input terminal can be electrically connected to ground 199 such that input transformer 102 is a balun (i.e., a balanced-to-unbalanced signal conversion-type transformer). In other embodiments, not shown, the input terminals of input winding 103 can be electrically connected to a positive input node and a negative input node, respectively, for receiving a differential RF input signal. Input winding 104 can have output terminals 105a, 105b at opposite ends. Output terminals 105a, 105b can be electrically connected to transistor chains 170a, 170b, as discussed in greater detail below. Input winding 104 can further have a center tap electrically connected to receive a bias voltage (VGB). Alternatively, input stage (S1) can have any other suitable configuration.

Output stage (S4) can include a voltage output transformer 192 (also referred to herein as an output transformer). Output transformer 192 can include two magnetically coupled output windings 193 and 194. Output winding 193 can have output terminals at opposite ends. In some embodiments, as illustrated, one output terminal of output winding 193 can be electrically connected to an output node 191 for outputting a voltage output signal (Vout) and the other output terminal can be electrically connected to ground 199. In other embodiments, not shown, the output terminals of output winding 193 can be electrically connected to positive and negative output nodes to output a differential voltage output signal. Output winding 194 can have input terminals 195a, 195b at opposite ends. One input terminal 195a can be electrically connected to transistor chain 170a and the other input terminal 195b can be electrically connected to transistor chain 170b. Additionally, output winding 194 can have a center tap electrically connected to receive a positive power supply voltage. As discussed in greater detail below, optionally, this positive supply voltage can be a variable positive supply voltage (e.g., an average power tracking positive supply voltage (VDD_APT)). Alternatively, output stage (S4) can have any other suitable configuration.

Power amplifier 10 can further include two symmetric parallel transistor chains 170a and 170b (also referred to herein as transistor chains). Each transistor chain 170a, 170b can include series-connected first, second, and third n-type field effect transistor (NFETs) connected to input transformer 102 at one end and output transformer 192 at the opposite end.

First NFETs 110a, 110b can be included within drive stage (S2). Each first NFET 110a, 110b can have a first source region electrically connected to ground (VSS), a first drain region electrically connected to a second source region of a second NFET 120a, 120b, and a first front gate 111a, 111b electrically connected to an output terminal 105a, 105b of input winding 104 of input transformer 102.

Second NFETs 120a, 120b and third NFETs 130a, 130b can be within power stage (S3). Each second NFET 120a, 120b can have a second source region electrically connected to a first drain region of a first NFET 110a, 110b, a second drain region electrically connected to a third source region of a third NFET 130a, 130b, and a second front gate 121a, 121b electrically connected to receive a first positive bias voltage (VG1) (also referred to as a first DC gate voltage). Each third NFET 130a, 130b can have a third source region electrically connected to a second drain region of a second NFET 120a, 120b, a third drain region electrically connected to an input terminal 195a, 195b of output winding 194 of output transformer 192, and a third front gate 131a, 131b electrically connected to receive a second positive bias voltage (VG2) (also referred to herein as a second DC gate voltage) that is different from VG1. Additionally, within power stage (S3), power amplifier 10 can further include capacitors 125a, 125b for second NFETs 120a, 120b and/or capacitors 135a, 135b for third NFETs 130a, 130b. More specifically, as illustrated in FIG. 1A, each capacitor 125a, 125b can be electrically connected between a second front gate 121a, 121b of a second NFET 120a, 120b and ground (VSS). Similarly, each capacitor 135a, 135b can be electrically connected between a third front gate 131a, 131b of a third NFET 130a, 130b and ground (VSS). Such capacitors can be employed to tune the gate capacitance of the second NFETs and/or the third NFETs (e.g., to achieve stability and/or improve performance).

In such a circuit structure, reliability specifications (e.g., temperature dependent dielectric breakdown (TDDB) off-state reliability specifications) limit the maximum gate-to-drain voltage (Vgd_max) for the transistors within the power amplifier 10. For example, in some embodiments, this Vgd_max could be 1.8V. As a result, such reliability specifications limit the Psat that can be achieved. However, in the disclosed embodiments, circuit structure 100 can be implemented using a fully depleted semiconductor-on-insulator technology processing platform (e.g., using a fully depleted silicon-on-insulator (FDSOI) technology processing platform) so that the first, second, and third NFETs of transistor chains 170a, 170b can all have both front and back gates, so that they can, optionally, have mixed threshold voltage types, and so that a unique biasing scheme can be employed that allows a relatively high Psat to be achieved without violation of the reliability specifications.

Figure 2:
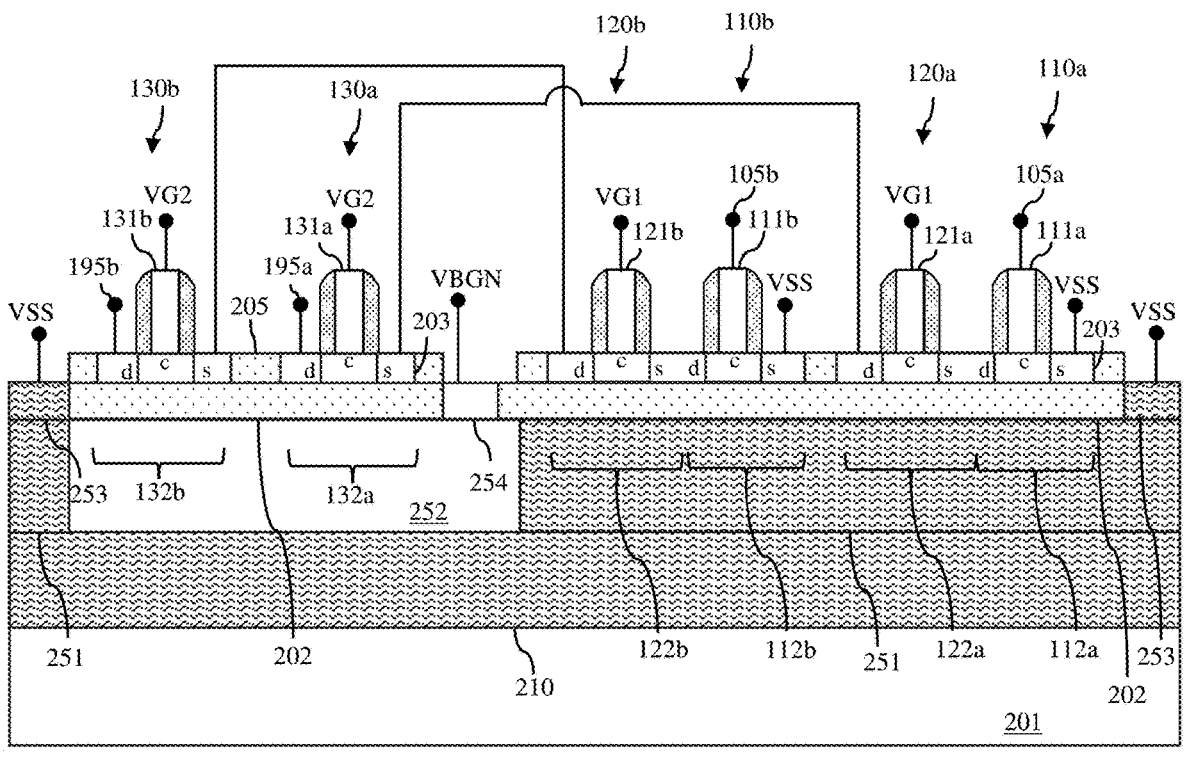
FIG. 2 is a cross-section diagram illustrating parallel transistor chains of the power amplifier implemented as a fully depleted semiconductor-on-insulator structure.

More particularly, FIG. 2 is a cross-section diagram illustrating, in greater detail, the parallel transistor chains 170a, 170b of power amplifier 10 of circuit structure 100 specifically incorporated into a fully depleted semiconductor-on-insulator (e.g., an FDSOI) structure 200. Structure 200 can include a semiconductor substrate 201. Semiconductor substrate 201 can be, for example, a monocrystalline silicon substrate or a substrate of any other suitable monocrystalline semiconductor material (e.g., silicon germanium, etc.). Structure 200 can further include semiconductor-on-insulator regions (e.g., SOI regions). Semiconductor-on-insulator regions can include an insulator layer 202 on semiconductor substrate 201. Insulator layer 202 can be, for example, a thin silicon dioxide layer or a relatively thin layer of any other suitable insulator material. Semiconductor-on-insulator regions can further include a thin semiconductor layer 203 on insulator layer 202. Semiconductor layer 203 can be, for example, a monocrystalline silicon layer or a layer of any other suitable monocrystalline semiconductor material (e.g., silicon germanium, etc.).

As mentioned above, each transistor chain 170a, 170b of the power amplifier 10 of the circuit structure 100 can include a first NFET 110a, 110b, a second NFET 120a, 120b, and a third NFET 130a, 130b connected in series. As illustrated in FIG. 2, each NFET 110a, 110b, 120a, 120b, 130a, 130b can include an active device region in a corresponding portion of semiconductor layer 203. The boundaries of the corresponding portions of semiconductor layer 203 (and thereby the boundaries of the active device regions) can be defined by isolation regions 205. Isolation regions 205 can be, for example, shallow trench isolation (STI) regions. That is, trenches can extend from the top surface of semiconductor layer 203 to and optionally through insulator layer 202, can laterally surround the active device regions of the transistors, and can be filled with one or more layers of isolation materials (e.g., silicon dioxide, silicon nitride, silicon oxynitride, etc.). Each NFET 110a, 110b, 120a, 120b, 130a, 130b can further include, within its active device region, a channel region (c) between source and drain regions (s/d). The source/drain regions can have N-type conductivity at a relatively high conductivity level (e.g., can be N+ source/drain regions) and the channel region can be either intrinsic (i.e., undoped) or can have P-type conductivity at a relatively low conductivity level (e.g., can be a P-channel region). Each NFET 110a, 110b, 120a, 120b, 130a, 130b can further include a corresponding front gate 111a, 111b, 121a, 121b, 131a, 131b (also referred to herein as a primary or control gate) adjacent to (e.g., above, and immediately adjacent to) the active device region at the channel region. Front gate 111a, 111b, 121a, 121b, 131a, 131b can include a relatively thin gate dielectric layer (including one or more layers of gate dielectric material) immediately adjacent to the channel region and a gate conductor layer (including one or more layers of gate conductor material) on the gate dielectric layer. Front gates could be any of gate-first polysilicon gate structures, gate-first high-K metal gate (HKMG) structures, gate-last HKMG structures (also referred to as a replacement metal gate (RMG) structure), or any other suitable type of front gate structures.

One advantage of fully depleted semiconductor-on-insulator (e.g., FDSOI) structures is that FETs can be formed on the insulator layer above wells of different conductivity types in order to achieve different threshold voltages (VTs). For purposes of this disclosure, a well (also referred to herein as a well region) refers to a region of semiconductor material doped (e.g., via a dopant implantation process or any other suitable doping process) so as to have a particular type of conductivity (e.g., N-type conductivity or P-type conductivity). A well doped so as to have N-type conductivity is referred to herein as an Nwell and a well doped so as to have P-type conductivity is referred to herein as a Pwell (see different dopants used to achieve different N-type and P-type conductivities discussed below). For super low threshold voltage (SLVT) or low threshold voltage (LVT) FETs, NFETs can be formed above Nwells and PFETs can be formed above Pwells. For regular threshold voltage (RVT) or high threshold voltage (HVT) FETs, NFETs can be formed above Pwells and PFETs can be formed above Nwells. Those skilled in the art will recognize that whether the FETs are SLVT or LVT FETs or whether they are RVT or HVT FETs will depend upon the design (e.g., device size, etc.) and process specifications (e.g., dopant concentrations, etc.).

In some embodiments, first NFETs 110a, 110b of the drive stage S2 of the power amplifier 10 and second NFETs 120a, 120b of the power stage (S3) of the power amplifier 10 can be LVT or SLVT NFETs. In other embodiments, first NFETs 110a, 110b of the drive stage S2 of the power amplifier 10 and second NFETs 120a, 120b of the power stage (S3) of the power amplifier 10 can be RVT NFETs. In some embodiments, third NFETs 130a, 130b of the power stage (S3) of the power amplifier 10 can be RVT or HVT NFETs. Optionally, the third NFETs 130a, 130b of the power stage (S3) of the power amplifier 10 can have relatively thick gate oxide layers as compared to the other NFETs.

For example, semiconductor substrate 201 can be a monocrystalline semiconductor substrate (e.g., a monocrystalline silicon substrate). Semiconductor substrate 201 can further be doped so as to have P-type conductivity at a relatively low conductivity level (e.g., so as to be a P-substrate). A Pwell 252 can be within an upper portion of semiconductor substrate 201 immediately adjacent to insulator layer 202. An Nwell 251 can also be within the upper portion of semiconductor substrate 201 immediately adjacent to insulator layer 202 and further positioned laterally immediately adjacent to Pwell 252. For example, Nwell 251 can laterally surround Pwell 252. An additional Nwell 210 (also referred to herein as a buried Nwell) can be within semiconductor substrate 201 below Pwell 252 and further extending laterally below Nwell 251. This additional Nwell 210 can, for example, be separated from the bottom surface of semiconductor substrate 201 by some distance and, thus, can provide electrical isolation between Pwell 252 and a lower portion of semiconductor substrate 201 (which as mentioned above is a P-substrate). In embodiments where first NFETs 110a, 110b and second NFETs 120a, 120b are to be LVT or SLVT NFETs and third NFETs 130a, 130b are to be RVT or HVT NFETs, first NFETs 110a, 110b and second NFETs 120a, 120b can be on insulator layer 202 above Nwell 251 and third NFETs 130a, 130b can be on insulator layer 202 above Pwell 252.

Another advantage of fully depleted semiconductor-on-insulator (e.g., FDSOI) structures is that back biasing (also referred to herein as back gate biasing) can be employed to fine tune the threshold voltages (regardless of whether the FETs are SLVT/LVT or RVT/HVT FETs). Forward back biasing (FBB) refers to applying a gate bias voltage to the back gate (particularly, to the well below the FET) to reduce the VT of a FET, thereby increasing the switching speed. Generally, for a PFET, FBB is achieved by applying 0.0 volts (V) or a negative gate bias voltage (VN) to the well; whereas, for an NFET, FBB is achieved by applying a positive gate bias voltage (VP) to the well. Reverse back biasing (RBB) refers specifically to applying a gate bias voltage to the back gate (particularly, to the well below the FET) to increase the VT of the FET, thereby decreasing the switching speed and reducing leakage current. Generally, for a PFET, RBB is achieved by applying VP to the well; whereas, for an NFET, RBB is achieved by applying VN to the well. More specifically, given the above described structure 200, each NFET 110a, 110b, 120a, 120b, 130a, 130b also has a corresponding back gate (e.g., see first back gates 112a, 112b of first NFETs 110a, 110b, second back gates 122a, 122b of second NFET 120a, 120b, and third back gates 132a, 132b of third NFETs 130a, 130b) Each back gate 112a, 112b, 122a, 122b, 132a, 132b includes adjacent portions of insulator layer 202 below the active device region of NFET 110a, 110b, 120a, 120b, 130a, 130b and either Pwell 252 or Nwell 251 below.

Wells 251-252 can each have one or more corresponding contact regions 253-254 (also referred to herein as taps), respectively, immediately adjacent thereto. That is, structure 200 can further include bulk regions (also referred to as hybrid regions). The bulk regions can be devoid of insulator layer 202 and instead can include one or more contact regions 253-254 on semiconductor substrate 201 immediately adjacent to each well 251-252 and electrically isolated from the active device regions of the transistors (e.g., by isolation regions 205). Each contact region 253-254 can include, for example, an epitaxially grown monocrystalline semiconductor layer (e.g., an epitaxially grown silicon layer or an epitaxially grown layer of any other suitable semiconductor material) on the top surface of semiconductor substrate 201 immediately adjacent to a well. Such contact regions (i.e., taps) can be doped (e.g., in situ or subsequently implanted) so as to have the same type of conductivity (e.g., N-type conductivity or P-type conductivity) as the well below, optionally at a higher conductivity level. For example, contact region(s) 254 for Pwell 252 can be P+ contact regions (i.e., Ptaps), whereas contact region(s) 253 for Nwell 251 can be N+ contact regions (i.e., Ntaps). Optionally, contact regions can further include silicide layers thereon (not shown).

Generally, fully depleted semiconductor-on-insulator structures (e.g., FDSOI structures) that include both semiconductor-on-insulator regions with semiconductor-on-insulator NFETs and/or PFETs and bulk regions with well taps to in-substrate Pwells and/or Nwells below the FETs are well known in the art and can have various configurations. Thus, the details thereof (e.g., and the processing techniques) have been omitted from the specification and drawings in order to allow the reader to focus on the salient aspects of the disclosed embodiments (e.g., related to optional mixed threshold voltages of the FETs within the power amplifier 10 and further related to a proposed biasing scheme for the FETs, as discussed below).

As mentioned above, by forming NFETs 110a, 110b, 120a, 120b, 130a, 130b with both front and back gates, a unique biasing scheme can be employed that allows a relatively high Psat to be achieved without violation of the reliability specifications.

More specifically, referring again to FIGS. 1A-1B, circuit structure 100 also includes additional circuitry 20. As shown in FIG. 1B, additional circuitry 20 can include multiple different voltage generators 21-24.

One of the different voltage generators can be a positive power supply voltage generator 21. This positive power supply voltage generator 21 can be connected to receive a maximum available power supply from a power source 29. For example, positive power supply voltage generator 21 can be electrically connected to a battery and the maximum available power supply can be, for example, a battery-supplied voltage (VBAT). Alternatively, power source 29 can be any other suitable power source. Positive power supply voltage generator 21 can further generate and output (i.e., can be configured to generate and output) a positive power supply voltage (VDD) that is less than the maximum available power supply (e.g., VDD<VBAT). In some embodiments, the positive power supply voltage can be variable. Specifically, in some embodiments, positive power supply voltage generator 21 can be an average power tracking (APT) voltage generator. An APT voltage generator can track (i.e., can be configured to track or monitor) the power output (Pout) of power amplifier 10 and can increase or decrease the positive power supply voltage (VDD) in order to fine tune Pout. If, for a particular application, Pout needs to be increased, VDD can be increased and vice versa. In this case, VDD can be referred to as an average power tracking VDD (VDD_APT).

Yet another one of the different voltage generators can be a voltage generator 23. This voltage generator 23 can be electrically connected to receive the positive power supply voltage (e.g., VDD_APT). That is, it can be powered with the same VDD_APT as the power amplifier 10. Thus, this voltage generator 23 is also referred to herein as an internal voltage generator. This voltage generator 23 can further generate and output (i.e., can be configured to generate and output) a first bias voltage (VG1) (also referred to herein as a first gate bias voltage) that is less than the positive power supply voltage (e.g., VG1<VDD_APT<VBAT).

Yet another one of the different voltage generators can be a low dropout voltage regulator 22. This low dropout voltage regulator 22 can be connected to receive the same maximum available power supply as positive power supply voltage generator 21 (e.g., VBAT). Low dropout voltage regulator 22 can further generate and output (i.e., can be configured to generate and output) a second bias voltage (VG2) (also referred to herein as a second gate bias voltage) that is less than the maximum available power supply but greater than or equal to the positive power supply voltage (e.g., VDD_APT≤VG2<VBAT).

Yet another one of the different voltage generators can be a negative bias voltage generator 24. This negative bias voltage generator 24 can generate and output (i.e., can be configured to generate and output) a negative bias voltage (VBGN) at some predetermined negative voltage level. Optionally, VBGN can be a temperature dependent VBGN. That is, negative bias voltage generator 24 can generate and output a VBGN that is variable and that tracks operating temperature. Specifically, in order to keep the threshold voltages (VTs) of the third NFETs 130a, 130b essentially constant, when temperature (T) increases, VBGN will become more negative and, when T decreases, VBGN will become less negative. For example, at T=110° C., VBGN=−2.5V, whereas at T=−40° C., VBGN=−1.5V.

Voltage generators (e.g., negative bias voltage generators, APT voltage generators, low drop out voltage generators, etc.) are well known in the art. Thus, the details thereof have been omitted from this specification in order to allow the reader to focus on the salient aspects of the disclosed embodiments related to the specific voltages generated by such voltage generators (e.g., VBGN, VDD_APT, VG1, and VG2), their use within the power amplifier 10, and their relationship to each other as described herein.

Specifically, referring to FIG. 2 in combination with FIGS. 1A-1B, N-type contact region(s) 253 (i.e., Ntap(s)) for Nwell 251 can be electrically connected to ground (VSS). Thus, first back gates 112a, 112b of first NFETs

110a, 110b in drive stage (S2) and second back gates 122a, 122b of second NFETs 120a, 120b in power stage (S3) are, for example, zero-biased. P-type contact region(s) 254 (i.e., Ptap(s)) for Pwell 252 can be electrically connected to the output of negative bias voltage generator 24 to receive VBGN. Thus, third back gates 132a, 132b of third NFETs 130a, 130b are negatively biased (i.e., the third NFETs 130a, 130b are RBB NFETs).

Additionally, first front gates 111a, 111b of first NFETs 110a, 110b within drive stage (S2) can be electrically connected to output terminals 105a, 105b of input winding 104 of input transformer 102 in input stage (S1), as discussed above. Second front gates 121a, 121b of second NFETs 120a, 120b within power stage (S3) can be electrically connected to an output of internal voltage generator 23 to receive VG1. Furthermore, third front gates 131a, 131b of third NFETs 130a, 130b can be electrically connected to an output of low dropout voltage regulator 22 to receive VG2.

Finally, output winding 194 of output transformer 192 in output stage (S4) can be electrically connected to an output of positive power supply voltage generator 21 to receive VDD_APT. As mentioned above, input terminals 195a, 195b of output winding 194 are also electrically connected to the third drain regions of third NFETs 130a, 130b.

With the above-described biasing scheme, application of VBGN to third back gates 132a, 132b of third NFETs 130a, 130b, reverse back biases these third NFETs 130a, 130b and, thus, increases their threshold voltages (VTs). By increasing the VTs of third NFETs 130a, 130b, VG2 can be set at a relatively high voltage level (e.g., at or above VDD_APT) in order to increase the power output (Pout) of the power amplifier 10 without violating a TDDB off-state reliability specification for third NFETs 130a, 130b (e.g., without violating a maximum gate-drain voltage (Vgd_max) of, for example, 1.6-1.8V). As a result, power amplifier 10 can exhibit a relatively high Psat (e.g., a Psat of approximately 28 dBm) and, thus, can be incorporated into a next generation RFIC that operates at a band (e.g., the 13 GHz band) within the 7-24 GHz range. Furthermore, by making VBGN temperature dependent, voltages and particularly positive and negative bias voltages (VCP) and (VCM) at the junctions between the drain regions of the second NFETs 120a, 120b and the source regions of the third NFETs 130a, 130b in each transistor chain 170a, 170b, respectively can be held essentially constant. By keeping VCP and VCM constant, second NFETs 120a, 120b can operate reliably across a range of operating temperatures.

Figures 3A, 3B:
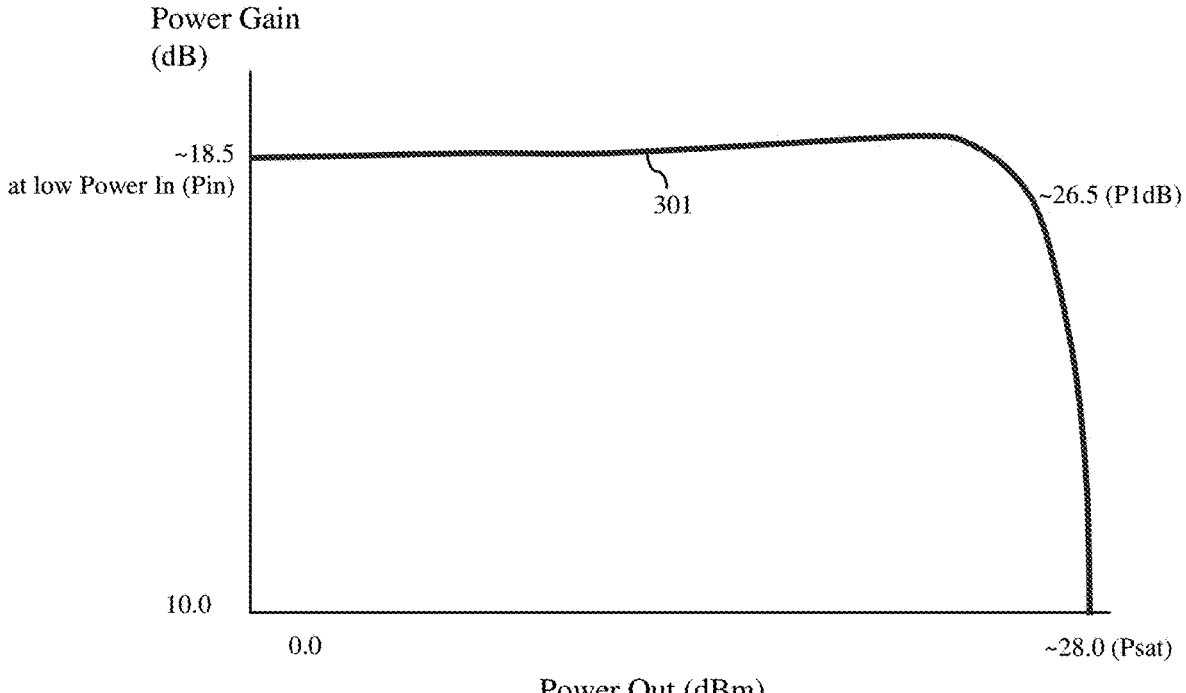
FIG. 3A is a table illustrating example voltage conditions that could be employed at room temperature and in a normal operating mode in the circuit structure of FIG. 1A.
FIG. 3B is a graph illustrating an example power gain-to-power out curve exhibited by the circuit structure of FIG. 1A under the voltage conditions of FIG. 3A.
Figure 3C:
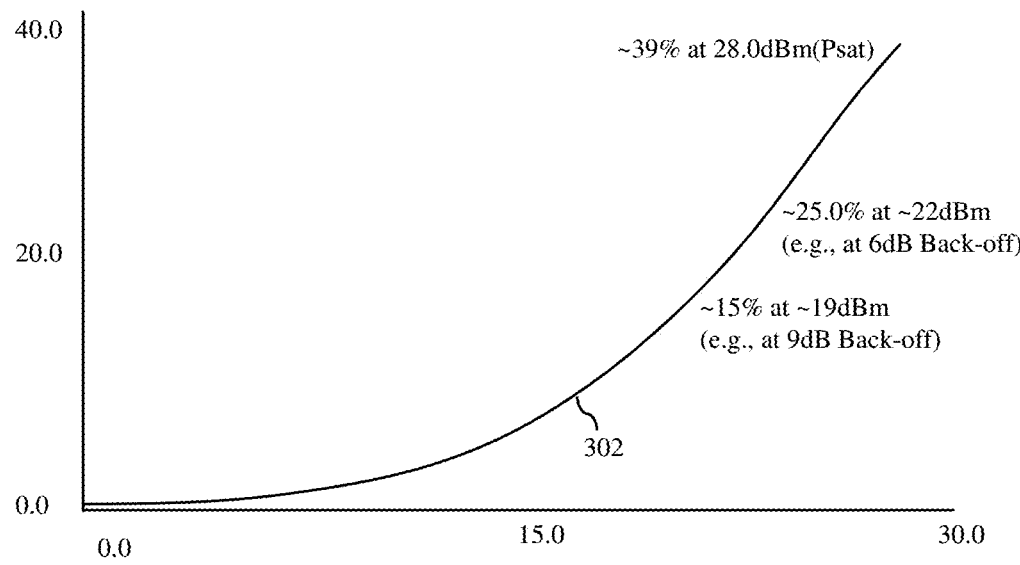
FIG. 3C is a graph illustrating an example power added efficiency-to-power out curve exhibited by the circuit structure of FIG. 1A under the voltage conditions of FIG. 3A.
Figure 3D:
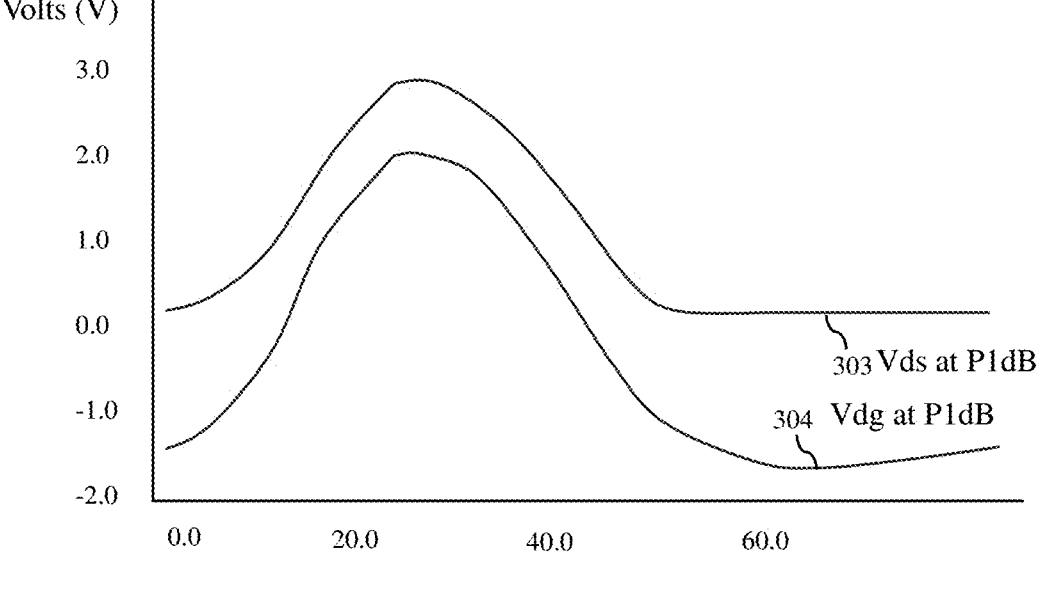
FIG. 3D is a graph showing example curves illustrating the drain-source voltage (Vds) over time at the one dB compression point (P1 dB) and the drain-gate voltage (Vdg) over time at P1 dB.

FIG. 3A is a table showing example values that could be employed for VDD_APT, VG1, VG2, VBGN at room temperature, and VCP/VCM. FIG. 3B is a graph illustrating an example power gain-to-power out curve 301 under the voltage conditions of FIG. 3A. As illustrated, in this case, the power gain constant value is approximately 18.5 dB, Psat is at approximately 28.0 dBm, and the one dB compression point (P1 dB) (i.e., the Pout level at which power gain decreases one dB from its constant value) is at approximately 26.5 P1 dB. FIG. 3C is a graph illustrating an example power added efficiency-to-power out curve 302 under the voltage conditions of FIG. 3A. As illustrated, in this case, power added efficiency (PAE) increases with power out. Specifically, PAE is approximately 15% at 9 dB back-off, approximately 25% at 6 dB back-off, and approximately 39% at Psat. FIG. 3D is a graph illustrating example curves 303 and 304 illustrating the drain-source voltage (Vds) over time at P1 dB and the drain-gate voltage (Vdg) over time at P1 dB.

Figures 4A, 4B:
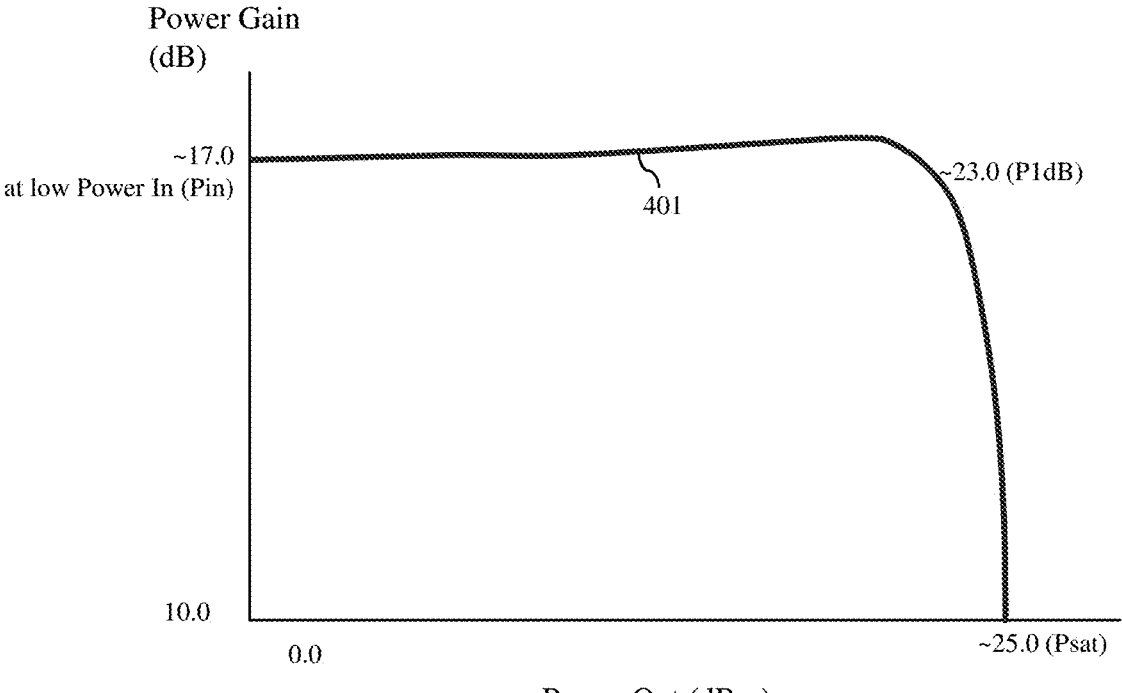
FIG. 4A is a table illustrating example voltage conditions that could be employed at room temperature and in a power control mode in the circuit structure of FIG. 1A.
FIG. 4B is a graph showing an example power gain-to-power out curve exhibited by the circuit structure of FIG. 1A under the voltage conditions of FIG. 4A.

In some embodiments, the disclosed circuit structure 100 can be selectively operated in either a normal mode or in a power control mode (also referred to herein as a battery power savings mode). During the normal mode, values for VDD_APT, VG1, VG2, VBGN at room temperature, and VCP/VCM can be set (e.g., according to the table of FIG. 3A) for optimal performance (e.g., Psat at approximately 28.0 dBm). During the power control mode, values for VDD_APT, VG1, VG2, VBGN at room temperature, and VCP/VCM can be scaled in order to save battery power. Entry into the power control mode can be on-demand (e.g., based on a user selection) and/or automatically triggered when the average output power of the power amplifier drops below some threshold level. Such scaling can be performed, for example, according to a look-up table (LUT) that provides different values for VG1, VG2, VGBN, and VCP/VCM for changes in VDD_APT. FIG. 4A is a table showing example values that could be employed for VG1, VG2, VBGN at room temperature, and VCP/VCM when VDD_APT drops to 1.8V in a power control mode from 2.6V in a normal mode (e.g., as shown in FIG. 3A). FIG. 4B is a graph illustrating an example power gain-to-power out curve 401 under the voltage conditions of FIG. 4A. As illustrated, in this case, the power gain constant value is approximately 17 dB, Psat is at approximately 25.0 dBm, and the one dB compression point (P1 dB) (i.e., the Pout level at which power gain decreases one dB from its constant value) is at approximately 23 P1 dB. Thus, in the power control mode there is a trade-off between power savings and maximum power out.

It should be understood that in the structures and method described above, a semiconductor material refers to a material whose conducting properties can be altered by doping with an impurity. Such semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped with a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region. Furthermore, when a semiconductor region or layer is described as being at a higher conductivity level than another semiconductor region or layer, it is more conductive (less resistive) than the other semiconductor region or layer; whereas, when a semiconductor region or layer is described as being at a lower conductivity level than another semiconductor region or layer, it is less conductive (more resistive) than that other semiconductor region or layer.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the terminology used herein is for the purpose of describing the disclosed structures and methods and is not intended to be limiting. For example, as used herein, the singular forms "a," "an" and "the" are intended to include the plural forms as well, unless the context clearly indicates otherwise. Additionally, as used herein, the terms "comprises," "comprising," "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right," "left," "vertical," "horizontal," "top," "bottom," "upper," "lower," "under," "below," "underlying," "over," "overlying," "parallel," "perpendicular," etc., are intended to describe relative locations as they are oriented and illustrated in the drawings (unless otherwise indicated) and terms such as "touching," "in direct contact," "abutting," "directly adjacent to," "immediately adjacent to," etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various disclosed embodiments have been presented for purposes of illustration but are not intended to be exhaustive or limiting. Many modifications and variations will be apparent to those of ordinary skill in the art without departing from the scope and spirit of the disclosed embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure including:
an output transformer connected to receive a positive power supply voltage and having input terminals; and
transistor chains connected to the input terminals, respectively, of the output transformer,
wherein each transistor chain includes an N-type field effect transistor (NFET) having a front gate connected to receive a positive bias voltage and a back gate connected to receive a negative bias voltage, and
wherein the negative bias voltage is variable and temperature-dependent.

2. The structure of claim 1, wherein the negative bias voltage becomes more negative when temperature increases and becomes less negative when temperature decreases causing a threshold voltage of the N-type field effect transistor to remain constant.

3. The structure of claim 1, wherein the positive power supply voltage is power output dependent.

4. The structure of claim 1, wherein the positive bias voltage is higher than the positive power supply voltage.

5. The structure of claim 1,
wherein each transistor chain includes at least a first NFET, a second NFET, and a third NFET connected in series between ground and an input terminal of the output transformer, and
wherein the third NFET has the front gate connected to receive the positive bias voltage and the back gate connected to receive the negative bias voltage.

6. The structure of claim 5,
wherein the first NFET has a first back gate connected to ground and a first front gate connected to an output terminal of an input transformer, and
wherein the second NFET has second back gate connected to ground and a second front gate connected to receive a different positive bias voltage that is lower than the positive bias voltage and the positive power supply voltage.

7. The structure of claim 5, wherein the first NFET and the second NFET have lower threshold voltages than the third NFET.

8. A structure including:
voltage generators outputting a positive power supply voltage, a negative bias voltage, a first positive bias voltage, and a second positive bias voltage, wherein the positive power supply voltage is higher than the first positive bias voltage and lower than the second positive bias voltage; and
an amplifier including:
an input transformer having output terminals;
an output transformer connected to receive the positive power supply voltage and having input terminals; and transistor chains connected between the input transformer and the output transformer,
wherein each transistor chain includes a first N-type field effect transistor (NFET), a second NFET, and a third NFET connected in series between ground and an input terminal of the output transformer,
wherein the first NFET has a first back gate connected to ground and a first front gate connected to an output terminal of the input transformer,
wherein the second NFET has a second back gate connected to ground and a second front gate connected to receive the first positive bias voltage,
wherein the third NFET has a third back gate connected to receive the negative bias voltage and a third front gate connected to receive the second positive bias voltage, and
wherein the negative bias voltage is variable and temperature-dependent.

9. The structure of claim 8, wherein the positive power supply voltage, the negative bias voltage, the first positive bias voltage, and the second positive bias voltage are mode dependent.

10. The structure of claim 8, wherein the voltage generators include a negative bias voltage generator generating and outputting a temperature dependent negative bias voltage to the third back gate of the third NFET in each of the transistor chains.

11. The structure of claim 10, wherein the temperature dependent negative bias voltage becomes more negative when temperature increases and becomes less negative when temperature decreases causing a threshold voltage of the third NFET in each transistor chain to remain constant and ensuring that voltages at junctions between the second NFET and the third NFET in each transistor chain remain essentially constant at varying temperatures.

12. The structure of claim 8, wherein the voltage generators further include an average power tracking voltage generator monitoring a power output of the amplifier and generating and outputting a power output dependent positive supply voltage to the output transformer.

13. The structure of claim 8, wherein the voltage generators further include a voltage regulator generating and outputting the second positive bias voltage at a voltage level higher than the positive power supply voltage to avoid a gate-to-drain voltage that violates a time dependent dielectric breakdown off-state reliability rating for the third NFET.

14. The structure of claim 8, wherein the first NFET and the second NFET have lower threshold voltages than the third NFET.

15. A structure including:
voltage generators outputting a positive power supply voltage, a negative bias voltage, a first positive bias voltage, and a second positive bias voltage, wherein the positive power supply voltage is higher than the first positive bias voltage and lower than the second positive bias voltage; and
an amplifier including:
an input transformer having output terminals;
an output transformer connected to receive the positive power supply voltage and having input terminals; and
transistor chains connected between the input transformer and the output transformer,
wherein each transistor chain includes a first N-type field effect transistor (NFET), a second NFET, and a third NFET connected in series between ground and an input terminal of the output transformer, wherein the first NFET and the second NFET have lower threshold voltages than the third NFET, wherein the first NFET has a first back gate connected to ground and a first front gate connected to an output terminal of the input transformer, wherein the second NFET has a second back gate connected to ground and a second front gate connected to receive the first positive bias voltage, wherein the third NFET has a third back gate connected to receive the negative bias voltage and a third front gate connected to receive the second positive bias voltage, and wherein the negative bias voltage is variable and temperature-dependent.

16. The structure of claim 15, further comprising:

a semiconductor substrate including:

a Pwell and an Nwell laterally surrounding the Pwell; and an additional Nwell below the Pwell and the Nwell; and an insulator layer the semiconductor substrate over the Pwell and the Nwell, wherein the third NFET of each transistor chain is on the insulator layer above the Pwell and the first NFET and the second NFET of each transistor chain are on the insulator layer above the Nwell.

17. The structure of claim 15, wherein the positive power supply voltage, the negative bias voltage, the first positive bias voltage, and the second positive bias voltage are mode dependent.

18. The structure of claim 15, wherein the voltage generators include a negative bias voltage generator generating and outputting a temperature dependent negative bias voltage to the third back gate of the third NFET in each of the transistor chains, and wherein the temperature dependent negative bias voltage becomes more negative when temperature increases and becomes less negative when the temperature decreases causing a threshold voltage of the third NFET in each transistor chain to remain constant and ensuring that voltages at junctions between the second NFET and the third NFET in each transistor chain remain essentially constant at varying temperatures.

19. The structure of claim 15, wherein the voltage generators further include an average power tracking voltage generator monitoring a power output of the amplifier and generating and outputting a power output dependent positive supply voltage to the output transformer.

20. The structure of claim 15, wherein the voltage generators further include a voltage regulator generating and outputting the second positive bias voltage at a voltage level higher than the positive power supply voltage to avoid a gate-to-drain voltage that violates a time dependent dielectric breakdown off-state reliability rating for the third NFET.

* * * * *